United States Patent [19]
Ho

[11] Patent Number: 6,146,995
[45] Date of Patent: Nov. 14, 2000

[54] METHOD FOR MANUFACTURING INTERCONNECTING PLUG

[75] Inventor: Ching-Yuan Ho, Hsinchu, Taiwan

[73] Assignee: Worldwide Semiconductor Manufacturing Corp., Taiwan

[21] Appl. No.: 08/985,698

[22] Filed: Dec. 5, 1997

[30] Foreign Application Priority Data

Oct. 17, 1997 [TW] Taiwan ................................. 86115290

[51] Int. Cl.[7] ..................... H01L 21/4763; H01L 21/302
[52] U.S. Cl. .................... 438/637; 438/626; 438/629; 438/631; 438/738
[58] Field of Search ................................ 438/626, 629, 438/631, 637, 738

[56] References Cited

U.S. PATENT DOCUMENTS

| | | | |
|---|---|---|---|
| 4,180,432 | 12/1979 | Clark | 156/643 |
| 5,374,591 | 12/1994 | Hasegawa et al. | 437/187 |
| 5,591,673 | 1/1997 | Chao et al. | 437/192 |
| 5,872,053 | 2/1999 | Smith | 438/626 |

Primary Examiner—Carl Whitehead, Jr.
Assistant Examiner—James Park
Attorney, Agent, or Firm—Cislo & Thomas LLP

[57] ABSTRACT

A method for forming interconnection plugs comprising the steps of providing a substrate having a dielectric layer formed thereon, wherein an opening exposing a pad area for connection with other structures is also formed in the dielectric layer. Next, a glue layer is formed over the pad area and the dielectric sidewalls of the opening. Subsequently, plug material is deposited into the opening forming a plug layer. This is followed by etching back the plug layer to return the plug material inside the opening to a level below the height of the dielectric layer. Then, a selective etching method having a high selectivity ratio between the dielectric layer and the plug layer is used to etch the dielectric layer. Finally, the dielectric layer and the plug layer are etched to almost the same level of height. The characteristic of this invention is the utilization of the higher etching r!ate of dielectric material with respect to the plug material so that the dielectric layer is etched back to the same level of height as the plug layer. Hence, the formation of recesses on the plug surface and the surface of subsequently deposited metallic layer is avoided.

13 Claims, 4 Drawing Sheets

METHOD FOR MANUFACTURING INTERCONNECTING PLUG

BACKGROUND OF THE INVENTION

1. Field of Invention

The present invention relates to a method for manufacturing semiconductor devices. More particularly, the present invention relates to a method for manufacturing interconnection plugs that can avoid the formation of recesses on plug surface.

2. Description of Related Art

Tungsten plug is now extensively used for interconnecting multiple layers in very large scale integration (VLSI). At present, how to control the formation of recesses in a tungsten etch-back operation is a major issue. To prevent short-circuiting current in the device caused by residual tungsten hanging onto the surface of a wafer, over-etching is often carried out during the tungsten etch-back operation. However, the longer the etching time is, the worse will be the phenomenon of recess formation on the surface of a tungsten plug. When the semiconductor demands a stack structure with a multiple of layers, the problem of recess formation will become worse. Recesses on the surface of the tungsten plug will lead either to a deterioration of the electrical properties of a semiconductor device or a low yield. Although the conventional chemical-mechanical polishing (CMP) method can redu!ce such recess formation, the machinery for carrying out the CMP operation are expensive and will increase the cost of production.

FIGS. 1A through 1D are cross-sectional views showing the progression of manufacturing steps in the production of a plug according to a conventional method. First, as shown in FIG. 1A, a substrate 10 is provided. This substrate 10, for example, has a bottom metallic layer 12, which are designed for connecting with structures in other areas. Then, a chemical vapor deposition (CVD) method is used to form a dielectric layer 14 over the substrate. Next, conventional photolithographic and etching processes are used to pattern the dielectric layer 14 forming an opening 16 that exposes the bottom metallic layer 12.

Next, as shown in FIG. 1B, a glue layer 18 is formed over the bottom metallic layer 12 of the opening 16, the dielectric sidewalls of the opening 16, and the dielectric layer 14 itself. The glue layer serves to increase the adhesive strength of subsequently deposited plug material, as well as to act as an etching stop layer. The glue layer 18 can be a titanium nitride (TiN) composite layer, for example. The method of forming the glue layer 18 includes depositing a titanium nitride layer over the bottom metallic layer 12, the dielectric sidewalls of the opening 16 and the dielectric layer 14, then performing a chemical vapor deposition method to deposit a layer of TiN over dielectric layer 14 and dielectric sidewalls of the opening 16. In a subsequent step, a chemical vapor deposition method is used to deposit plug material 20 over the glue layer 18 above the dielectric layer 14 and the glue layer 18 above the opening 16. The plug material 20, for example, can be tungsten or aluminum.

Next, as shown in FIG. 1C, using an anisotropic dry etching method or a chemical-mechanical polishing (CMP) method, the plug material 20 is etched back removing the whole top layer of the plug material 20 and exposing the dielectric layer 14 so that a plug is formed with the remaining plug material. However, one of the defects in this conventional plug production method is the formation of recesses 22 on the plug surface.

Next, as shown in FIG. 1D, subsequent processes are performed. For example, a metallic layer 24 is deposited over the plug, and a stack structure that includes bottom metallic layer 12/plug/metallic layer 24 is formed. Because the plug surface has a recess, the metallic layer 24 also has a recess 26. When a multiple of these stacks are required in the semiconductor, the problem of recess formation will be amplified. Furthermore, in subsequent steps, when another layer of dielectric is deposited over this metallic layer 24, residual dielectric material that resides in the recess is difficult to remove, thereby leading to a deterioration of electrical properties or a lower yield.

In light of the foregoing, there is a need in the art to provide a better method for manufacturing interconnection plug.

SUMMARY OF THE INVENTION

Accordingly, the present invention is directed to a method for forming interconnection plugs that do not use chemical-mechanical polishing machinery and yet able to obtain recess-free plugs. Thus, deterioration of the electrical properties or lowering of the yield is prevented.

To achieve these and other advantages and in accordance with the purpose of the invention, as embodied and broadly described herein, the invention provides a method for forming plugs comprising the steps of providing a substrate having a dielectric layer formed thereon, wherein an opening exposing a pad area for connection with other structures is also formed in the dielectric layer. Next, a glue layer is formed over the pad area, the dielectric sidewalls of the opening and the dielectric layer. Subsequently, plug material is deposited into the opening forming a plug layer. This is followed by back etching the plug layer to return the plug material inside the opening to a level below the height of the dielectric layer. Because the glue layer TiN has been etched and dielectric layer is exposure for low selectivity ratio of W to TiN. Then, a selective etching method having a high selectivity ratio between the dielectric layer and the plug layer is used to etch the dielectric layer. Eventually, the dielectric layer and the plug layer are etched to almost the same height level.

The main characteristic of this invention is the utilization of the higher etching rate of dielectric material with respect to the plug material to etch back the dielectric layer and the plug layer so that they both come to about the same height level. Hence, the formation of recesses on the plug surface and subsequently deposited metallic layer is avoided. Consequently, there are no deterioration of electrical properties or lowering of yield for the semiconductor devices produced by this method. Moreover, no expensive chemical-mechanical polishing machinery is used.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
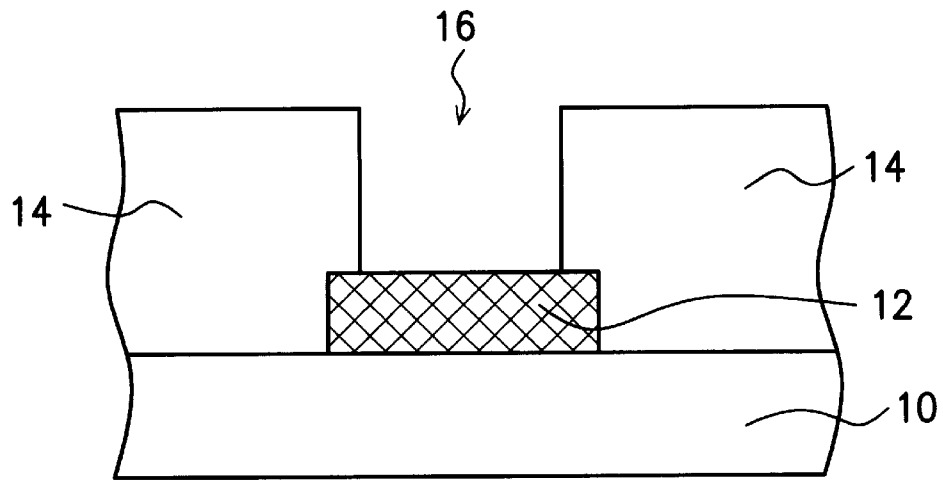
FIGS. 1A through 1D are cross-sectional views showing the progression of manufacturing steps in the production of a plug according to a conventional method.
Figure 1B:
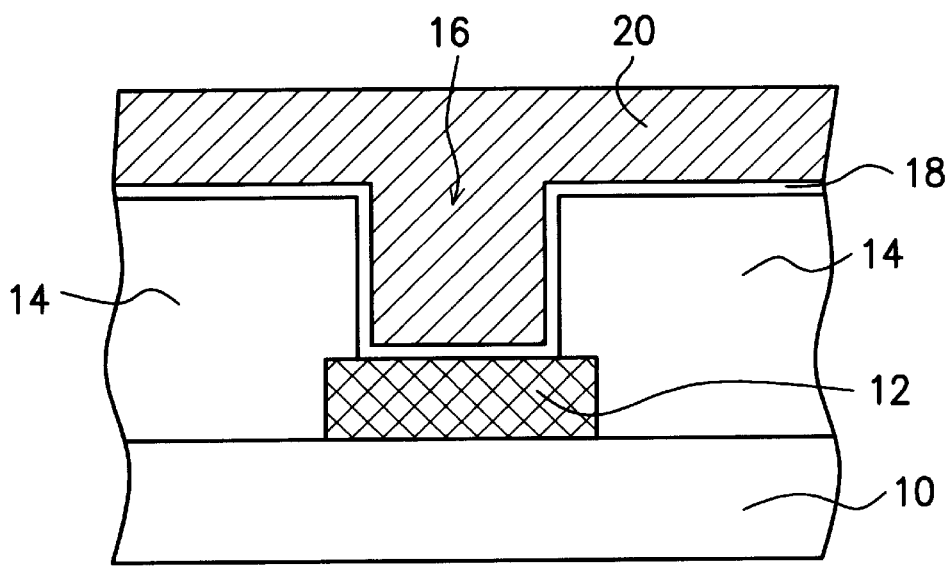
Figure 1C:
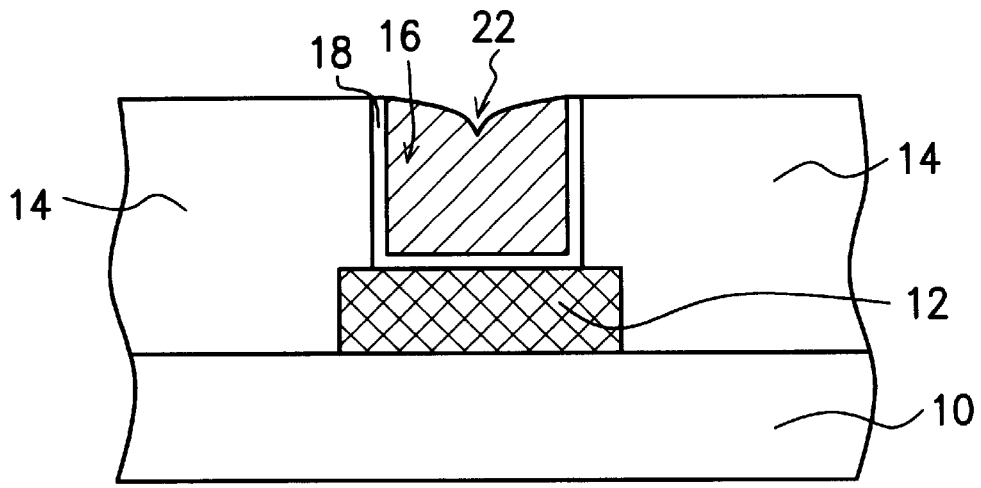
Figure 1D:
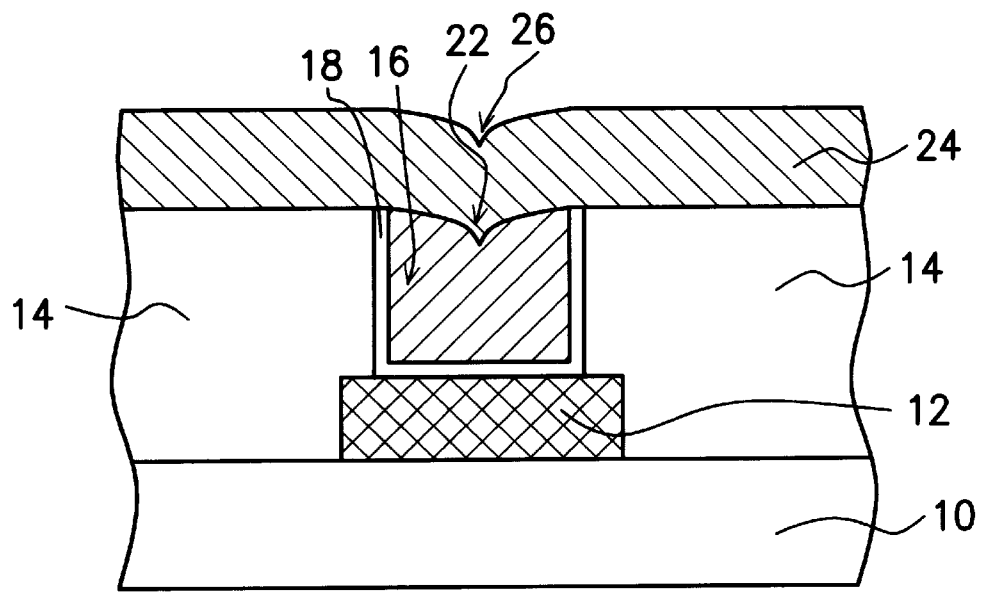

Reference will now be made in detail to the present preferred embodiments of the invention, examples of which are illustrated in the accompanying drawings. Wherever possible, the same reference numbers are used in the drawings and the description to refer to the same or like parts.

Figure 2A:
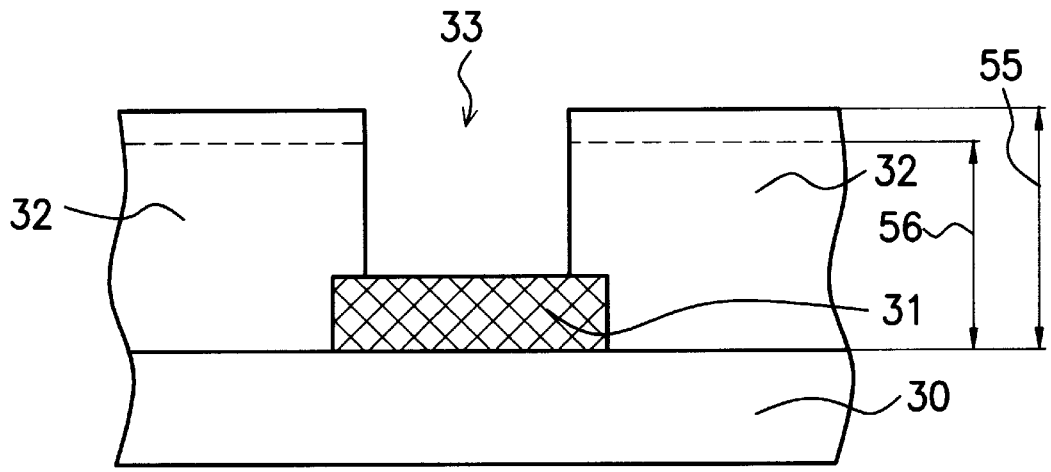
FIGS. 2A through 2E are cross-sectional views showing the progression of manufacturing steps in the production of a plug according to one preferred embodiment of this invention.

FIGS. 2A through 2E are cross-sectional views showing the progression of manufacturing steps in the production of a plug according to one preferred embodiment of this invention. First, as shown in FIG. 2A, a substrate 30 having a bottom metallic layer 31 already formed thereon is provided. The bottom metallic layer 31 is a region for connecting to other structures, and the material for the metallic layer can be an aluminum alloy, for example. Next, a dielectric layer 32 is formed over the substrate structures using a conventional chemical vapor deposition method. The dielectric layer is formed, for example, by depositing silicon dioxide. In this embodiment, the height level of the dielectric layer 32 (labeled 55) is higher than the final height level (labeled 56). Thereafter, conventional photolithographic and etching processes are used to pattern the dielectric layer 32 forming an opening 33 that exposes the bottom metallic layer 31. In this embodiment, a bot!tom metallic layer 31 is chosen as an example. However, this invention need not restricted to just that. The opening 33 can also expose, for example, a source/drain region (not shown) in the substrate 30, where the source/drain region is a region for connecting to other structures.

Figure 2B:
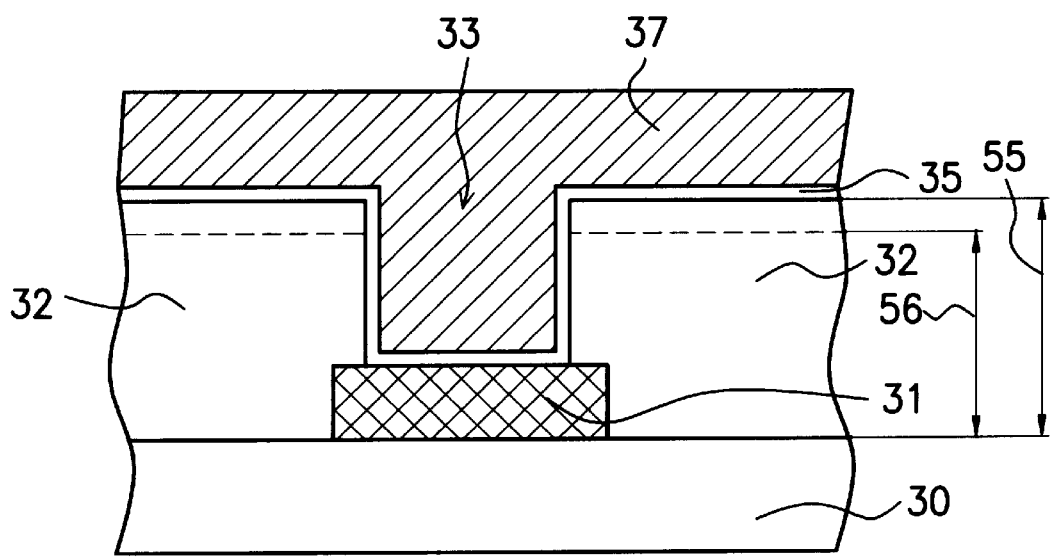

Next, as shown in FIG. 2B, a glue layer 35 is formed over the bottom metallic layer 31 of the opening 33, the dielectric sidewalls of the opening 33, and the dielectric layer 32 itself. The glue layer 35 serves to increase the adhesive strength of subsequently deposited plug material. The glue layer 35 can be a titanium nitride (TiN) composite layer, for example. The method of forming the glue layer 35 includes depositing a titanium nitride layer over the bottom metallic layer 31, the dielectric sidewalls of the opening 33 and the dielectric layer 32, then performing a chemical vapor deposition method to deposit a layer of TiN layer over dielectric layer32. In a subsequent step, a chemical vapor deposition method is used to deposit plug material 37 over the glue layer 35 above the dielectric layer 32 and the opening 33. The plug material 37, for example, can be tungsten or aluminum.

Figure 2C:
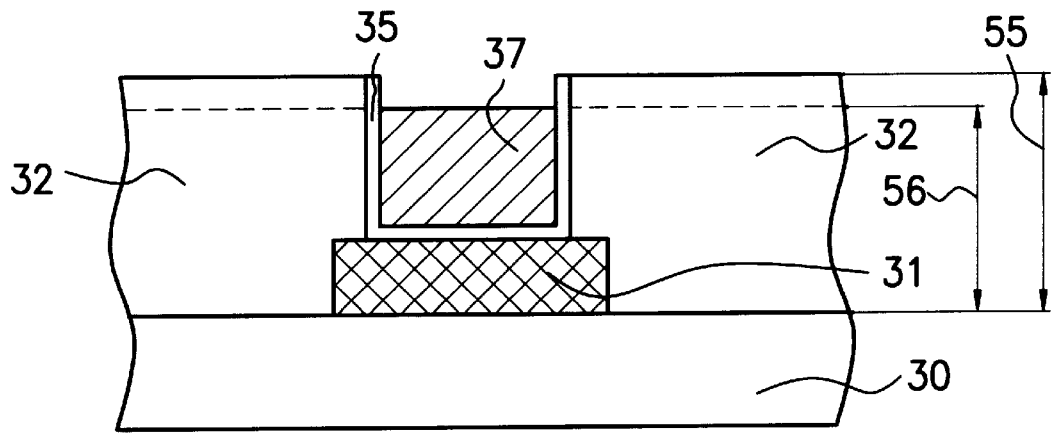

Next, as shown in FIG. 2C, an anisotropic back etching method is used to etch the plug material 37 forming a plug. In this invention, the height level of the plug material 37 after the etching back operation is almost the same as the final height level 56 of the dielectric layer 32.

Figure 2D:
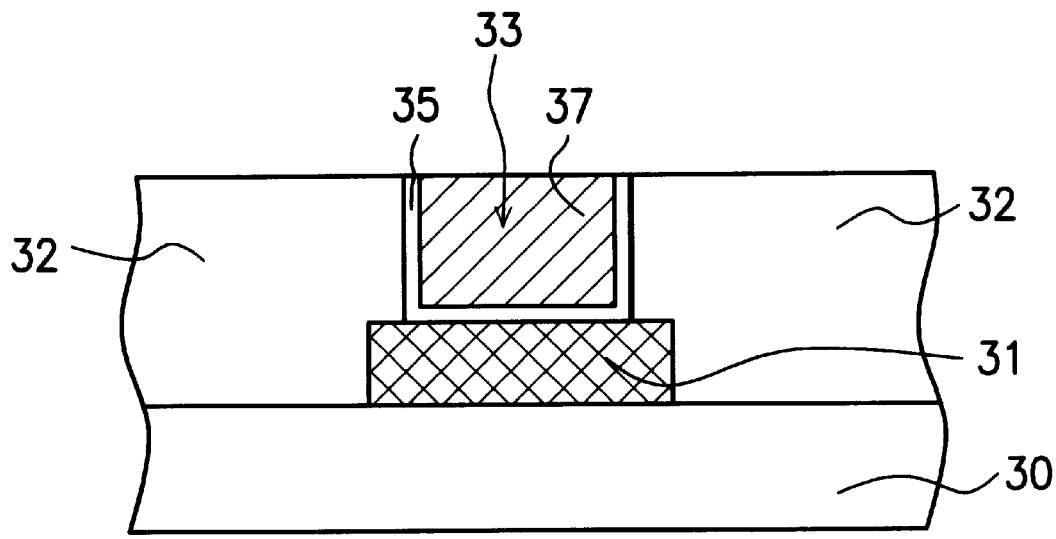

Next, as shown in FIG. 2D, a selective etching method having a high selectivity ratio between the dielectric layer 32 and the plug material 37 is used to etch the dielectric layer 32 and the plug material 37. If the dielectric layer 37 is a silicon dioxide layer and the plug material is tungsten, then a gaseous mixture such as $C_4F_8/CO/Ar/O_2$ can be used as a gaseous etchant. Because this gaseous etchant has a higher etching rate for the dielectric layer 32 than the plug material 37, eventually the same height level for the dielectric layer 32 and the plug can be reached. That is, the plug is at the same height level as the desired height level 56 of the dielectric layer 32.

Figure 2E:
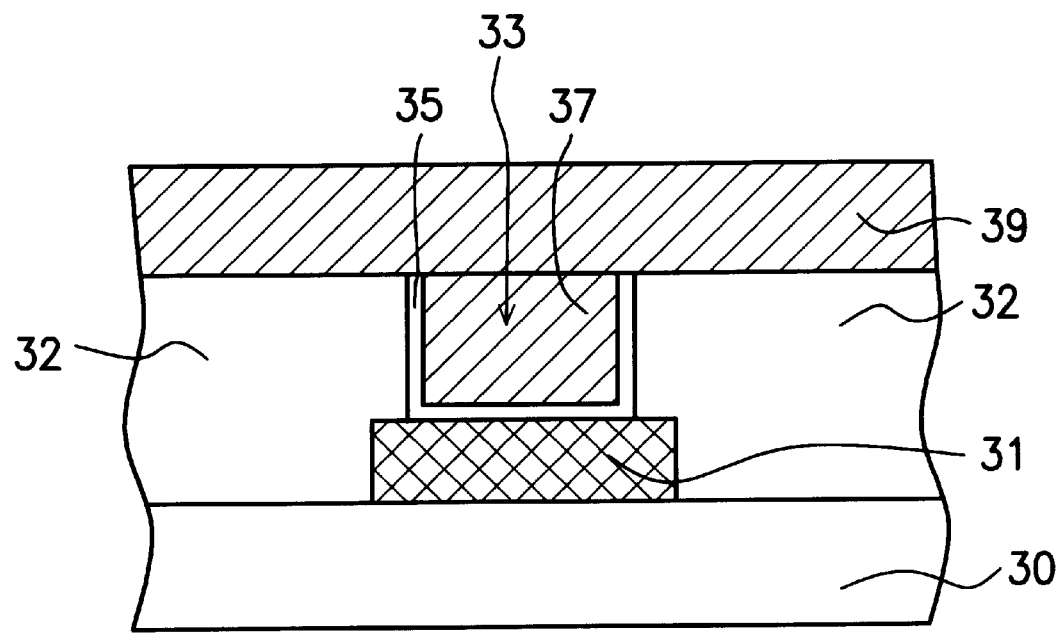

Finally, as shown in FIG. 2E, subsequent processes are performed. For example, a metallic layer 39, which can be an aluminum alloy, is formed over the plug using a chemical vapor deposition method.

The characteristic of this invention is the utilization of the higher etching rate of dielectric layer 32 with respect to the plug material 37 such that the dielectric layer 32 is etched back to approximately the same level of height as the plug. Hence, the formation of recesses on the plug surface inside the opening 33 and the formation of recesses in the surface of subsequently deposited metallic layer are avoided. Consequently, there is no deterioration of electrical properties or lowering of yield for the semiconductor devices produced by this method. Moreover, no expensive chemical-mechanical polishing machinery is used, and so production cost can be saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing plugs comprising the steps of:

providing a solid and continuous substrate that has a dielectric layer already formed thereon, wherein the dielectric layer also has an opening that exposes a pad area above the substrate for connection with other structures;

forming a glue layer over the pad area above the substrate and over the dielectric side walls of the opening;

forming a plug layer covering and filling the opening;

etching back the plug layer to form a plug such that the plug material inside the opening is etched away to a height level lower than the dielectric layer; and etching the dielectric layer using an etchant which is a gaseous mixture of $C_1F_8/CO/Ar/O_2$ such that the final level of height for the dielectric layer is about the same as the level of height of the plug; whereby recessing of the top of the plug is suppressed and a conductive plug is formed over the pad area.

2. The method of claim 1, wherein the step of providing the substrate further includes the step of forming a bottom metallic layer over the substrate and the subsequent deposition of a dielectric layer over the bottom metallic layer.

3. The method of claim 2, wherein the pad area above the substrate for connection with other structures is a bottom metallic layer.

4. The method of claim 1, wherein the step of forming the plug layer includes depositing tungsten.

5. The method of claim 1, wherein the step of forming the plug layer includes depositing aluminum.

6. The method of claim 1, wherein the step of forming the dielectric layer includes depositing silicon dioxide.

7. The method of claim 1, wherein the step of forming the glue layer including depositing a titanium nitride composite layer.

8. The method of claim 1, wherein the step of forming the glue layer includes the substeps of depositing a titanium nitride layer over the pad area for connection with other structures at the bottom of the opening, the dielectric sidewalls of the opening and the dielectric layer itself.

9. The method of claim 8, wherein the step of forming the titanium nitride layer includes using a chemical vapor deposition method.

10. The method of claim 1, wherein the step of forming the plug layer includes using a chemical vapor deposition method.

11. The method of claim 1, wherein the step of etching back the plug layer includes using a dry etching method.

12. The method of claim 1, wherein the step of etching the dielectric layer includes using a selective etching method that has a higher etching rate for the dielectric layer than the plug layer.

13. The method of claim 1, wherein after the step of etching the dielectric layer, further includes depositing a metallic layer over the plug.

* * * * *